United States Patent [19]

Eggermont

[11] 4,231,100
[45] Oct. 28, 1980

[54] ARRANGEMENT FOR FILTERING COMPRESSED PULSE-CODE-MODULATED SIGNALS

[75] Inventor: Ludwig D. J. Eggermont, Eindhoven, Netherlands

[73] Assignee: U.S. Philips Corporation, New York, N.Y.

[21] Appl. No.: 972,605

[22] Filed: Dec. 22, 1978

[30] Foreign Application Priority Data

Jan. 13, 1978 [NL] Netherlands .......................... 7800406

[51] Int. Cl.³ .......................................... G06F 15/31
[52] U.S. Cl. ..................................... 364/724; 370/109; 375/26; 375/34
[58] Field of Search .......................... 364/724; 325/42; 340/347 DD; 179/15 AV

[56] References Cited

U.S. PATENT DOCUMENTS

| | | | |
|---|---|---|---|
| 3,752,970 | 8/1973 | Aaron et al. ................ | 179/15 AV X |
| 3,766,546 | 10/1973 | Aaron et al. ................ | 340/347 DD |
| 3,988,606 | 10/1976 | Eggermont .......................... | 364/724 |
| 3,992,616 | 11/1976 | Acker ................................... | 364/724 |
| 4,125,866 | 11/1978 | Van Essen et al. ................... | 364/724 |

*Primary Examiner*—Jerry Smith
*Attorney, Agent, or Firm*—Thomas A. Briody; William J. Streeter; Edward W. Goodman

[57] ABSTRACT

Digital filter for filtering nonuniformly quantized pulse code-modulated signals formed by a sequence of code words each comprising a segment number $s(i)$ and a mantissa number $m(i)$. This digital filter comprises a modifying device to which the mantissa numbers $m(i)$ are applied for generating modified mantissa numbers $E(i)$. The numbers $E(i)$ are each multiplied by the magnitude of a filter coefficient, for generating first product numbers $z_1(i)$. Thereafter these numbers $z_1(i)$ are each multiplied by a number $2^{B(i)}$, $B(i)$ being either equal to $s(i)$ or equal to $s(i)-1$, so that second product numbers $z_2(i)$ are obtained which are applied to an accumulator.

3 Claims, 5 Drawing Figures

ARRANGEMENT FOR FILTERING COMPRESSED PULSE-CODE-MODULATED SIGNALS

A. BACKGROUND OF THE INVENTION

1. Field of the Invention

The invention relates to a digital filter arrangement for filtering non-uniformly quantitised pulse code-modulated signals formed by a succession of code groups x(i) each comprising a segment number s(i) and a mantissa number m(i).

2. Description of the Prior Art

As known non-uniform pulse code-modulation enables the conversion of information signals, which vary over a large dynamic range, into code groups whose number of bits is smaller than the number of bits from which the numbers should consist which would be obtained by uniform pulse code-modulation. The result is that when using non-uniform pulse code-modulation, the bit rate on the transmission path is lower than with uniform pulse code-modulation and that the signal-to-quantising noise ratio over a considerable portion of the dynamic range is constant.

A non-uniformly quantised pulse code-modulated signal is obtained by performing a non-linear processing on the information signal. This non-linear processing operation is known as compression. The characteristic indicating the relationship between the information signal and the non-uniformly pulse code-modulated signal is called the compression characteristic. The most customary compression characteristics are the 13-segment A-law and the 15-segment $\mu$-law characteristics.

The segment number s(i) in the code group x(i) now indicates, in base-2-code, the segments number. This number s(i) comprises $N_1$ bits which are called the characteristic bits. If, for the compression, use is made of one of the two above-defined compression characteristics, then $N_1 = 3$ and the binary coded segment number is equal to $s_2 s_1 s_0$, wherein $s_0$ represents the least significant and $s_2$ the most significant bit and wherein $s_j$ is equal to 1 or 0.

The mantissa number m(i) in the code group x(i) indicates, in base-2-code, the number of quantising steps on the segment s(i). This number m(i) comprises $N_2$ bits which are called the mantissa bits. When using the above defined compression characteristics, $N_2$ is equal to 4. The number m(i) is now given by $e_3 e_2 e_1 e_0$. Also here it holds that $e_0$ is the least significant and $e_3$ the most significant bit and that $e_j$ has the value 1 or 0.

As known (see for example reference 2), filtering a digital signal formed by a sequence of numbers z(i) means that a sequence of numbers y(i) must be determined, the relationship between y(i) and z(i) being given by the expression $$y(i) = \sum_{k=0}^{N-1} a(k)z(i - k) \qquad (1)$$

if a non-recursive digital filter is used. In (1), a(k) represents a weighting factor which is called the filter coefficient.

If a recursive digital filter is used for filtering a digital signal, the relationship between y(i) and z(i) is given by the expression:

$$y(i) = \sum_{k=0}^{N-1} a(k)z(i - k) - \sum_{k=1}^{M} b(k)y(i - k) \qquad (2)$$

In (2) a(k) and b(k) again represent filter coefficients.

If now a non-uniformly quantised pulse code-modulated signal is applied to the digital filter, in order that a useful result may be obtained, to first convert this signal into a uniformly quantised pulse code-modulated signal formed by a sequence of numbers z(i) each related in a manner still to be described (see also reference 1) to the numbers s(i) and m(i).

When designing a digital filter, there are two parameters which have an extremely important influence on the ultimate implementation. First, there is the required storage capacity and second, the maximum permissible internal processing rate.

For a non-recursive digital filter (see expression 1), the required storage capacity is determined by the value of N and the number of bits of the numbers a(k) and z(j). For a recursive digital filter (see expression 2), the required storage capacity is, in addition, determined by the value M and the number of bits of the numbers b(k) and y(i).

The internal processing rate is inter alia determined by the number of bits of the numbers a(k), b(k), z(i) and y(i).

Since, in general, a number s(i) in the uniformly quantised pulse code-modulated signal will comprise a greater number of bits than a code group x(i) in the non-uniformly quantised pulse code-modulated signal, it is advantageous to store the code groups x(i), as described in reference 3, instead of the numbers z(i).

The non-recursive digital filter, described in reference 3, for non-uniformly quantised pulse code-modulated signals, is constituted more in particular by a cascade arrangement of N storage sections, each arranged for storing and supplying a code group x(i). The output of each of the storage sections is connected to an adding arrangement through a branch in which a storage medium is incorporated. The products of all possible values of z(i) and the filter coefficients a(k), characteristic for the relevant branch, are stored in each of these storage media. If it is now assumed that the products a(k), z(i−k), stored in the storage media, consist of thirteen bits, the storage capacity of each storage medium must be $13 \times 2^8$ so that a total storage capacity of $8 N + 13 \times 2^8 \times N$ bits is required in this digital filter. Since the product of a(k) and z(i−k) has been stored in the storage medium, the internal processing rate may be low since now only N adding operations need be performed. In contradistinction therewith is the enormously large storage capacity required, amounting to some hundreds of thousands of bits for normal values of N (for example N = 100).

SUMMARY OF THE INVENTION

It is an object of the invention to provide a different concept of a digital filter arrangement for filtering non-uniformly quantised pulse code-modulated signals in which a considerably smaller storage capacity is sufficient with only a limited increase of the number of adding operations. In accordance with the invention a digital filter arrangement is therefore provided with a first storage medium comprising first storage locations for storing the segment numbers s(i=k) and second storage locations for storing the mantissa numbers $m(i-k)$ of a plurality of N consecutive code groups $x(i-k)$ where $k=0, 1, 2, \ldots, N-1$ and where $i = \ldots -3, -2, -1, 0, 1, 2, 3, \ldots$, and for consecutively supplying the stored groups;

a second storage medium for storing the absolute value $|a(k)|$ of N filter coefficients $a(k)$ and for consecutively supplying stored absolute values $|a(k)|$;

means coupled to the second storage locations for modifying the mantissa number $m(i-k)$ and for generating modified mantissa numbers $E(i-k)$;

first multiplying means connected to the modifying means and coupled to the second storage medium for generating first product numbers $z_1(i-k) = E(i-k) \cdot |a(k)|$;

second multiplying means connected to the first multiplying means;

means for coupling the second multiplying means to the first storage locations; and accumulating means coupled to the second multiplying means.

The invention is based on the application of the commutative law applicable to the multiplication of numbers. As will be further explained hereinafter, it holds that the relationship between $E(i)$ and $z(i)$ is given by an expression of the form $$|z(i)| = E(i) \cdot 2^{B(i)} \qquad (3)$$

Herein $B(i)$ represents an integer and $|z(i)|$ represents the absolute value of $z(i)$. If the sign of $z(i)$ is represented by sign $[z(i)]$, so that $z(i) = \text{sign}\,[z(i)] \cdot |z(i)|$, then it holds, for example for a non-recursive digital filter, that $$y(i) = \sum_{k=0}^{N-1} a(k)\,\text{sign}\,[z(i-k)] \cdot E(i-k) \cdot 2^{B(i-k)} \qquad (4)$$

Since, as will appear hereinafter, $E(i)$ does not comprise more than six bits and $2^{B(i)}$ does not comprise more than seven bits, $z(i)$ is a thirteen-bit number. Since $a(k)$ represents, on the average, a twelve-bit number, then, for (1), thirteen-bit numbers must be multiplied, performing the processing operations defined in, by twelve-bit numbers within a given available period of time $T_o$.

In accordance with the invention $E(i-k)$ is first multiplied by $|a(k)|$; this is the multiplication of a six-bit number by a twelve-bit number. A period of time substantially equal to $T_o$ is available for this multiplication. The eighteen-bit number obtained by this multiplication must still be multiplied by $2^{B(i-k)}$. However, this multiplication can be realized, for example, by means of a radix point translator controlled by the number $B(i-k)$. The setting of this translator then corresponds to a multiplication of the first product number $E(i-k) \cdot |a(k)|$, applied to it, by the factor $2^{B(i-k)}$.

A particularly interesting embodiment of a digital filter for filtering non-uniformly quantised pulse code-modulated signals is obtained by converting the filter coefficient $a(k)$, in the manner extensively described in reference 4, into a minimum number of multiplication factors whose magnitudes are equal to $2^{F(k,j)}$, wherein $F(k,j)$ is an integer. The first multiplying means can now be entirely disposed with and the numbers $E(i-k)$ are directly applied to the radix point translator. This translator is then controlled by the output signal of an adder arrangement to which the numbers $B(i-k)$ and $F(k,j)$ are applied for generating the sum number $B(i-k) + F(k,j)$. The setting of the radix point translator now corresponds to the multiplication of $E(i-k)$ by the number $2^{B(i-k) + F(k,j)}$.

SHORT DESCRIPTION OF THE FIGURES

References

Figure 1:
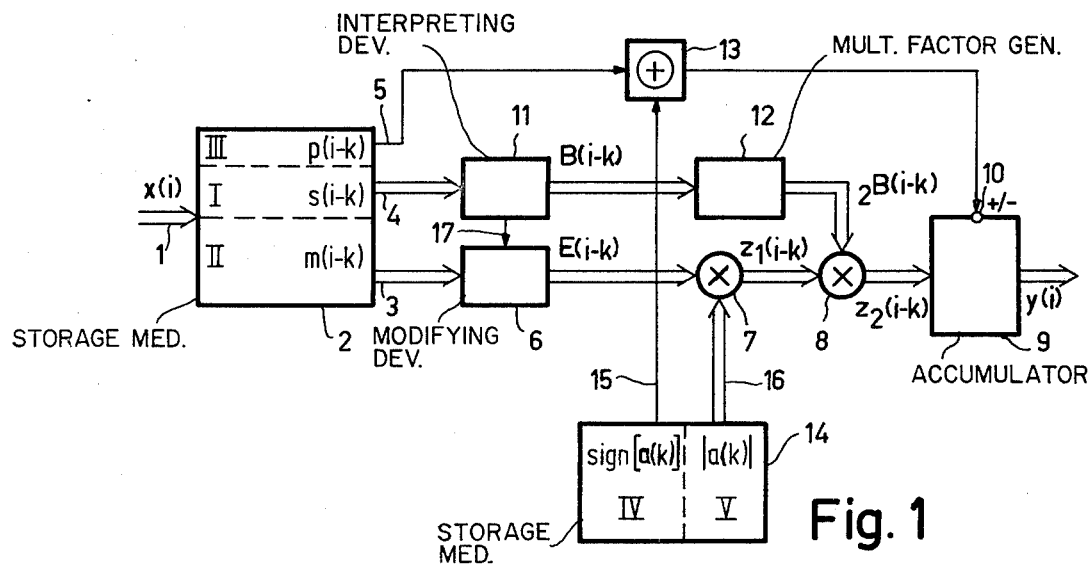
FIG. 1 shows a digital filter arrangement for filtering the pulse code-modulated signals compressed in accordance with the A-law.

1. A Unified Formulation of Segment Companding Laws and Synthesis of Codecs and Digital Companders; H. Kaneko; The Bell Systems Technical Journal, September 1970; pages 1555–1588.
2. Digital Signal Processing; A. V. Oppenheim, R. W. Schafer; Prentice-Hall, Inc.
3. Stored Product Digital Filtering with Non-linear Quantization; O. Monkewich, W. Steenaart; Proceedings 1976 IEEE International Symposium on Circuits and Systems; pages 157–160.
4. U.S. Pat. No. 3,988,606.
5. Designer's Guide to: Digital Filters (part six); B. J. Leon, S. C. Bass; EDN, May 20, 1974, pages 61–68.
6. U.S. Pat. No. 3,965,338
7. U.S. Pat. No. 4,002,981.
8. U.S. Pat. No. 3,988,607.

DESCRIPTION OF THE EMBODIMENTS

1. Theoretical basis

Reference 1 contains an extensive theoretical treatise about the expansion of the code groups $x(i)$ of non-uniformly quantised pulse code-modulated signals and also describes some arrangements for performing this expansion. From reference 1 it can be derived that the practically applied A-law characteristic corresponds to the characteristic indicated in reference 1 by "A law-DLA-mid-riser". In addition it can be derived that the practically used $\mu$-law characteristic corresponds to the characteristic indicated in reference 1 as "$\mu$-law-DLA-mid-tread." The following description will be limited to these two compression characteristics, although the measures according to the invention are also directly applicable in the case of, for example, the "$\mu$-law-DLA-mid-riser" characteristic.

As appears from reference 1, it holds for the 13-segments A-law-DLA-mid-riser characteristic that:

$$|z(i)| = 2^{s(i) - \mu}\{m(i) + P\} - Q \qquad (4)$$

where:

$$s(i) = s_2 2^2 + s_1 2^1 + s_0 2^0 \qquad (5)$$
$$m(i) = e_3 2^3 + e_2 2^2 + e_1 2^1 + e_0 2^0 \qquad (6)$$

$$P = N \cdot \mu + 2^{-1}$$

$$Q = 0$$

$$N = 2 \exp N_2$$

Herein $N_2$ represents the number of bits in m(i) so that $N_2 = 4$. Furthermore it holds that:

$\mu = 0$ for $s(i) = 0$
$\mu = 1$ for $s(i) \neq 0$ so that for $s(i) = 0$ it holds that $$|z(i)| = m(i) + 2^{-1}$$
$$|z(i)| = e_3 2^3 + e_2 2^2 + e_1 2^1 + e_0 2^0 + 2^{-1} \quad (7)$$

and for $s(i) \neq 0$ it then holds that $$|z(i)| = 2^{s(i)-1} \{m(i) + 2^4 + 2^{-1}\}$$

$$|z(i)| = 2^{s(i)-1} \{2^4 + e_3 2^3 + e_2 2^2 + e_1 2^1 + e_0 2^0 + 2^{-1}\} \quad (8)$$

The numbers E(i), which are introduced in paragraph B and which are produced by the modifying means are now equal to 0 $e_3 e_2 e_1 e_0$, 1 if s(i) is equal to 000.

If, however, s(i) is unequal to 000, then E(i) is equal to 1 $e_3 e_2 e_1 e_0$, 1.

From the above it follows that if s(i) is equal to 000, the number E(i) is obtained by inserting a one-bit to m(i) in a position which is one bit position lower than the bit position of the least significant bit in m(i). Put differently, should m(i) be given by the number 1101 then E(i) becomes equal to 1101, 1. If s(i) is unequal to 000 then the number E(i) is obtained by inserting a one-bit to m(i) both in a position which is one bit position lower than the bit position of the least significant bit in m(i), and in a position which is one-bit position higher than the bit position of the most significant bit in m(i). Put differently, should m(i) again be given by 1101, E(i) then becomes equal to 11101, 1.

For the 15-segment $\mu$-law-DLA-mid-tread it then holds that:

$$P = 2^{22} + 2^{-1}$$

$$Q = 2^{N_2} + 2^{-1}$$

so that $$|z(i)| = 2^{s(i)} \{2^4 + e_3 2^3 + e_2 2^2 + e_1 2^{-1} + e_0 2^0 + 2^{-1}\} - (2^4 + 2^{-1}) \quad (9)$$

The number E(i) produced by the modifying means is now equal to 1$e_3 e_2 e_1 e_0$, 1 and is again obtained by inserting a nne-bit to m(i) in a position lower than the bit position of the least significant bit in m(i), as well as in the position which is one bit position higher than the bit position of the most significant bit in m(i).

2. The A-law non-recursive digital filter arrangement

From the expressions (7) and (8) in paragraph (1), it follows that $|z(i)| = E(i) \cdot 2^{B(i)}$, wherein $B(i) = s(i)$ if $s(i) = 000$ and wherein $B(i) = s(i) - 1$ if $s(i) \neq 000$. An output number y(i) of a non-recursive digital filter is now given, in accordance with the expression (1), by $$y(i) = \sum_{k=0}^{N-1} a(k) \text{ sign } [z(i-k)] E(i-k) \cdot 2^{B(i-k)} \quad (10)$$

$$= \sum_{k=0}^{N-1} 2^{B(i-k)} \{a(k) \text{ sign } [z(i-k)] E(i-k)\}$$

Performing the processing operations defined in (10) on the code groups x(i), from which the non-uniformly quantised pulse code-modulated signal consists, requires an arrangement, the general set-up of which is shown in FIG. 1. The non-recursive digital filter arrangement shown in FIG. 1., for filtering non-uniformly quantised pulse code-modulated signals in accordance with the A-law, comprises an input 1 to which the code groups x(i) are applied. Connected to this input 1 there is a storage medium 2 (for example a RAM) for storing the N code groups x(i), x(i−2), ..., x(i−k), ..., x(i−N+1), wherein i= ... −3, −2, −1, 0, 1, 2, 3, ... As previously remarked, each of these code groups x(i−k), k=0, 1, 2, ... N−1 comprises a segment number s(i−k) and a mantissa number m(i−k). Apart from these numbers each code group x(i−k) also comprises a polarity bit which will be denoted by p(i−k). The segment numbers s(i−k) are stored in the storage locations of the storage medium 2 which are indicated by I, the mantissa numbers m(i−k) are stored in the storage locations indicated by II and the polarity bits p(i−k) are stored in the storage locations indicated by III. Furthermore it should be noted that sign $[z(-k)] = p(i-k)$.

The storage medium 2 comprises three outputs, denoted by 3, 4 and 5, respectively. The code groups x(i−k) stored in this storage medium 2 can be read therefrom in the customary manner (see, for example, reference 5). From a read-out code group x(i−k) the mantissa number m(i−k) is applied to the output 3, the associated segment number s(i−k) is applied to the output 4 and the associated polarity bit is applied to the output 5.

The output 3 of the storage medium 2 is connected to an input of a modifying device 6 which each time converts a mantissa number m(i−k) applied thereto into the modified mantissa number E(i−k). This modified mantissa number E(i−k) is applied to a multiplier 7 for producing a first product number $z_1(i'k)$. These first product numbers $z_1(i-k)$ are further applied to a second multiplier 8 for producing second product numbers $z_2(i-k)$ which are applied to an accumulator 9. This accumulator 9 comprises an add-subtract control input 10 to which one-bit numbers are applied. Each time this one-bit number is equal to "0" $z_2(i-k)$ is added to the contents of the accumulator and each time the one-bit number is equal to "1" the second product number $z_2(i-k)$ is subtracted the accumulator contents.

The output 4 of the storage medium 2 is connected to an input of an interpreting device 11 which interprets the segment numbers s(i−k) and produces output numbers B(i−k), wherein each time s(i−k)=000, B(i−k) is equal to s(i−k), and each time s(i−k)≠000, B(i−k) is equal to s(i−k)−1. These numbers B(i−k) are applied to a multiplication factor generator 12 which, as a result of the number B(i−k) applied thereto, produces a number the value of which corresponds to $2^{B(i-k)}$. Said last number is now applied to the multiplier 8 in order to be multiplied by $z_1(i-k)$ so that $$z_2(i-k) = z_1(i-k) 2^{B(i-k)}$$

The output 5 of the storage medium 2 is connected to a first input of a modulo-2-adder 13 whose output is connected to the add-subtract control input 10 of accumulator 9.

In addition to the storage medium 2 in which the code groups x(i) are stored, this digital filter arrangement comprises a second storage medium 14 in which said filter coefficients a(k) are stored. Each of these filter coefficients contains a polarity bit which will be denoted by sign [a(k)] and a number which will be denoted by |a(k)| and which represents the magnitude of the filter coefficient. The polarity bits sign [a(k)] are now stored in the storage locations of the storage medium 14 which are indicated by IV and the numbers |a(k)| are stored in the storage locations indicated by V.

The storage medium 14 comprises two outputs denoted by 15 and 16, respectively. The filter coefficients a(k), stored in this medium, can be read out again in the customary manner (see also reference 4). The polarity bit sign [a(k)] of a read-out filter coefficient is applied to the modulo-2-adder 13 and the number |a(k)| is applied to the multiplier 7. Thus the first product number $z_1(i-k)$ is equal to $E(i-k) \cdot |a(k)|$. The polarity bit associated with this product number now occurs at the output of the modulo-2-adder 13.

If it is now assumed that the polarity bit for a positive number is equal to "0" and that of a negative number is equal to "1", the modulo-2-adder 13 produces an 0-bit if the two polarity bits applied thereto are identical, (both "1" or both "0"). The result thereof is that $z_2(i-k)=E(i-k) \cdot |a(k)| \cdot 2^{B(i-k)}$ is added to the contents of the accumulator 9. If the two polarity bits applied to the modulo-2-adder are not identical it produces a 1-bit, so that $z_2(i-k)$ is subtracted from the contents of the accumulator.

It should be noted, as appears from paragraph E(1), that $E(i-k)$ is not only determined by $m(i-k)$, but also by $s(i-k)$. For this reason the interpreting device 11 comprises an output 17 at which a 1-pulse occurs if $s(i-k) \neq 000$ and at which a 0-pulse occurs in $s(i-k)=000$. These pulses are applied to the modifying device 6. The set-up of the interpreting device and of the modifying device will be further described in paragraph (3).

Since, as appears from expressions (1) and (10), each output number y(i) is constituted by a finite sum of N second product numbers $z_2(i-k)$, each time N second product numbers $z_2(i-k)$ have been formed and added together in the accumulator 9, starting from the N code groups stored in the storage medium 2 and the N filter coefficients a(k), this accmulator 9 is read out in known manner and reset to the zero position.

Since the numbers produced by the multiplication factor generator 12 are all a whole power of two, namely $2^{B(i-k)}$, the multiplier 8 can be implemented as mentioned previously, as a radix point translator. This translator is then controlled by the numbers $2^{B(i-k)}$ produced by the multiplication factor generator 12 and set so that its output number $z_2(i-k)$ corresponds to $z_1(i-k) \cdot 2^{B(i-k)}$. For shortness' sake, reference is made to reference 6 and 7 for an implementation of such a radix point translator.

It should be noted that although the bits of the multi-bit numbers such as s(i), m(i), B(i), E(i), etc. may occur in series as well as in parallel, it is assumed in the embodiment shown in FIG. 1 that the bits of the multi-bit numbers occur in parallel. To this end the connections in FIG. 1 at which multi-bit numbers occur are indicated by the arrow symbol →. This symbol will also be used hereinafter.

The multiplication factor generator 12 may be implemented as a decoding network to which the numbers B(i−k) are applied, and which produces, for example, a seven-bit number containing only one 1-bit. The position of this 1-bit within the number is determined by B(i−k). If, for example B(i−k)=000 the generator 12 produces, for example, a number $0000001 = 2^0$; if B(i−k)=001 it produces the number $0000010 = 2^1$; etc.

3. The interpreting and modifying device

Figure 2:
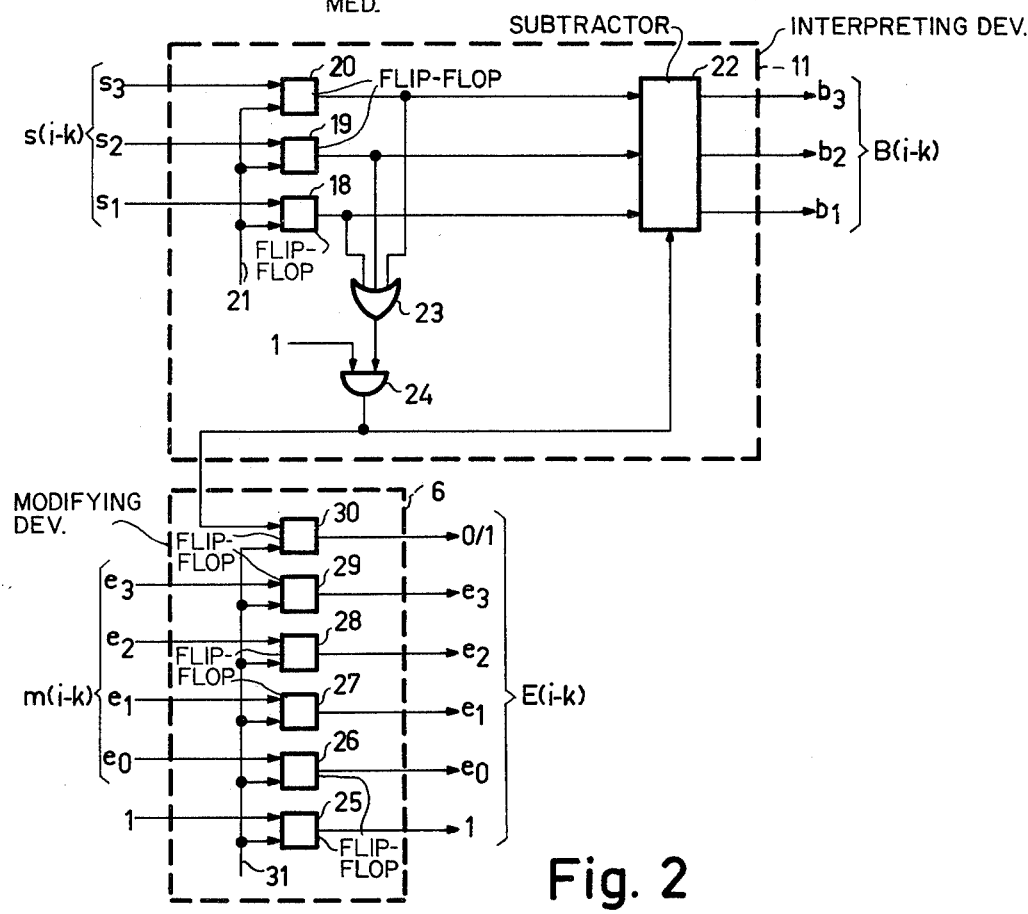
FIG. 2 shows an embodiment of an interpreting arrangement and a modifying arrangement for use in the arrangement of FIG. 1.

A possible embodiment of an interpreting device of a modifying device for use in the digital filter arrangement of FIG. 1 is shown in FIG. 2.

The interpreting device 11 shown in FIG. 2 comprises three flipflops, for example three D-flipflops 18, 19, 20 to which the bits $s_1$, $s_2$ and $s_3$, respectively, of the segment number $s(i-k)$, are applied. Through a lead 21 a clock signal is also applied to these flipflops 18, 19, 20. The outputs of the flipflops 18, 19, 20 are connected on the one hand to inputs of a subtractor 22 for parallel processing and to inputs of an OR-gate 23, on the other hand. The output of this OR-gate 23 is connected to an input of an AND-gate 24 to which also a logic value "1" is applied. The output of the AND-gate 24 is connected to an input of the subtractor 22.

The interpreting device 11 to which the segment numbers $s(i-k)$ are applied, and which produces the numbers $B(i-k)$, operates as follows. A segment number $s(i-k)$ read from storage medium 2 is entered, at an instant determined by a clock pulse on lead 21, into the flipflops 18, 19 and 20. If $s(i-k)$ is equal to 000 the OR-gate 23 and the AND-gate 24 produce a "0" so that the subtractor 22 produces the number $B(i-k)=-s(i-k)=000$. If $s(i-k) \neq 000$, the OR-gate 23 and AND-gate 24 produce a "1" so that the subtractor 22 produces the number $B(i-k)=s(i-k)-1$.

The modifying device 6, also shown in FIG. 2, is constituted by six flipflops 25 to 30 inclusive, which are also assumed to be of the D-type, and the bits of which occurring at the outputs, constitute together the modified number $E(i-k)$. The logic value "1" is applied to the flipflop 24, bits $e_0$, $e_1$, $e_2$ and $e_3$, respectively, of $m(i-k)$ are applied to the flipflops 26 to 29 inclusive, and the logic values produced by the AND-gate 24 in the interpreting device are applied to the flipflop 30. A clock signal is also applied through a lead 31 to these flipflops 25 to 30 inclusive. At an instant determined by a clock pulse on lead 31, the six bits offered to the modifying device 6 are written into the flipflops 25 to 30 inclusive and $E(i-k)$ is determined by the content of these flipflops.

4. The μ-law non-recursive digital filter arrangement

From expression (9) in paragraph (1) it follows that $$|z(i)| = E(i) \cdot 2^{s(i)} - (2^4 + 2^{-1})$$

An output number y(i) of a non-recursive digital filter is now given in accordance with expression (1) by:

$$y(i) = \sum_{k=0}^{N-1} [2^{s(i-k)} \cdot \{a(k)p(i-k)E(i-k)\} - \{a(k)p(i-k)(2^4 + 2^{-1})\}] \quad (11)$$

$$y(i) = \sum_{k=0}^{N-1} a(k)p(i-k)E(i-k) \cdot 2^{(i-k)} - \sum_{k=0}^{N-1} a(k)p(i-k)(2^4 + 2^{-1})$$

Figure 3:
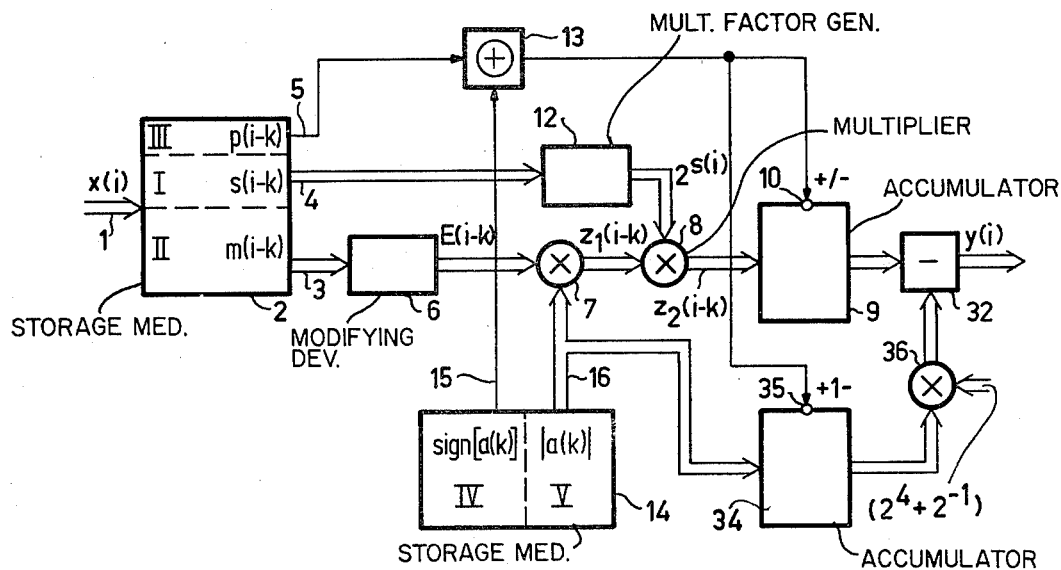
FIG. 3 shows a digital filter arrangement for filtering pulse code-modulated signals compressed in accordance with the $\mu$-law.

For performing the processing operations defined in (11), use can be made of the digital filter arrangement shown in FIG. 3. This arrangement, shown in FIG. 3, is implemented to a very great extent in the same manner as the arrangement of FIG. 1. In FIG. 3 elements corresponding to elements in FIG. 1 have been given the same reference numerals as in FIG. 1. The arrangement shown in FIG. 3 differs from the arrangement shown in FIG. 1 in that no interpreting device 11 is used, the modifying device 6 is not controlled by the numbers s(i) or signals corresponding thereto. This means that the modifying device can be set-up in the manner shown in FIG. 2, on the understanding, however, that now a logic "1" (cf. expression 9) is applied to the flipflop 30 instead of the output signal of the AND-gate 24. In the embodiment of FIG. 3 a subtracting device 32 is further connected to the output of the accumulator 9 to which subtracting device 32 not only the contents read from the accumulator 9 but also a number which corresponds to the second term in expression (11) is applied. More in particular, this number is obtained by means of a second accumulator 34 to which the numbers $|a(k)|$, stored in the storage locations V of the storage medium 14, as well as the polarity bits produced by the modulo-2-adder 13, are applied. More in particular, these polarity bits are applied to the adding-subtracting control input 35 of the accumulator 34. Each time the content of the accumulator 9 is applied to the subtracting device 32, the content of the accumulator 34 is applied to a multiplying device 36 to which also a fixed multiplication factor equal to $2^4 + 2^{-1}$ is applied. The product occurring at the output of this multiplying device 36 is their subtracted in the subtracting device 32 from the content of the accumulator 9 and the difference thus obtained is the desired output number y(i).

5. Use of time-efficient multiplication

In paragraph (2) it has already been noted that the ultimate implementation of a digital filter is inter alia determined by the maximum permissible processing rate which determines the plurality of filter coefficients which can be considered and the plurality of bits of the numbers which must be multiplied by one another. Reference 4 describes how the time available for determining an output number y(i) of a digital filter can be used as efficiently as possible or, put differently, how a multiplication can be effected as efficiently as possible. To this end, as extensively explained in reference 4, each filter coefficient a(k) is replaced by a plurality of positive and/or negative multiplication factors f(k,j), wherein the sign of f(k,j) is given by sign [f(k,j)] and wherein the magnitude $|f(k,j)|$ of f(k,j) is accurately equal to $2^{F(k,j)}$, where F(k,j) represents a positive integer, so that $$a(k) = \sum_j \text{sign }[f(k,j)] \cdot 2^{F(k,j)} \quad (12)$$

Let it be assumed, by way of first example, that $a(k) = +000111 \ (= +7)$. This filter coefficient can now be composed from the multiplication factors $f(k,1) = +01000 \ (= +2^3)$ and $f(k,2) = -000001 \ (= -2^0)$. Let it also be assumed, as a second example, that $a(k) = +011101 \ (= +29)$. This filter coefficient can now be composed from the multiplication factors $f(k,1) = +100000 \ (= +2^5)$, $f(k,2) = -000100 \ (= -2^2)$ and $f(k,3) = +000001 \ (= +2^0)$.

By converting each of the filter coefficients in the above described manner into a plurality of multiplication factors, the multiplier which must be used for multiplying the number E(i−k) by the filter coefficients a(k). (cf. 7 in the FIGS. 1 and 3) can, as described in reference 4, be implemented, just like the multiplier 8, as a radix point translator, the setting of which is controlled by the number $|f(k,j)|$. A digital filter which can be implemented on the basis of the basic consideration defined above will be called "digital filter with time-efficient multiplication."

In a digital filter for filtering signals, use can now be made in a particularly interesting manner of time-efficient multiplication. By not storing each of the multiplication factors f(k,j) itself but only its polarity sign [f(k,j)] and the number F(k,j), the whole mathematical process defined in expression (1) can be realized by means of only one single radix point translator and one accumulator.

If an A-law non-recursive digital filter should be realized, then it follows from (10) and (12) that $$y(i) = \sum_{k=0}^{N-1} 2^{B(i-k)} \cdot \quad (13)$$
$$\{p(i-k) \cdot E(i-k) \cdot \sum_j \text{sign }[f(k,j)] \, 2^{F(k,j)}\} =$$
$$\sum_{k=0}^{N-1} \sum_j p(i-k) \cdot \text{sign }[f(k,j)] \cdot E(i-k) \cdot 2^{B(i-k)+F(k,j)}$$

Figure 4:
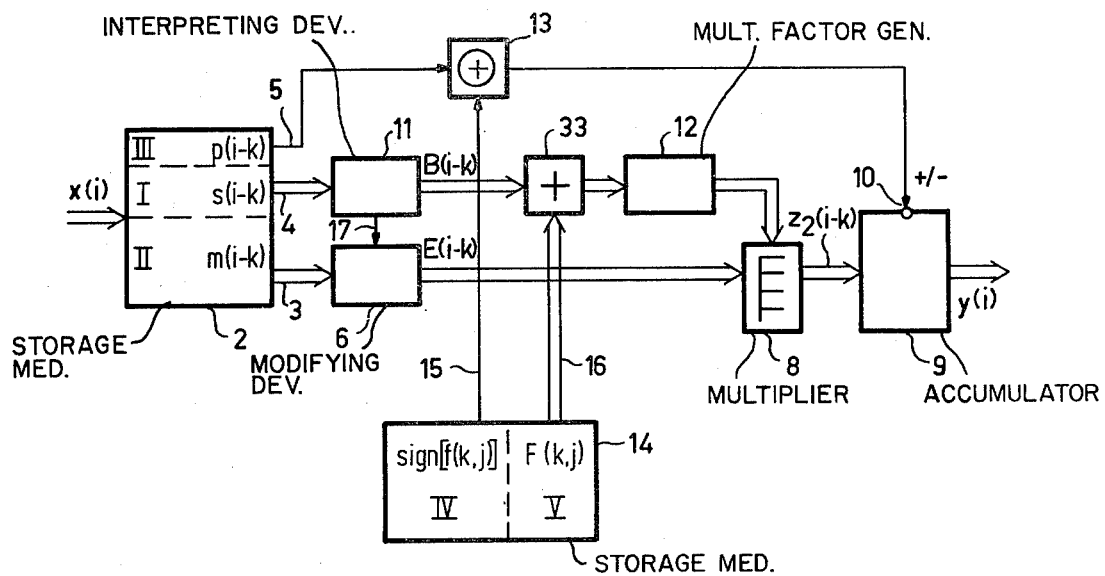
FIG. 4 shows a digital filter arrangement for filtering the pulse code-modulated signals compressed in accordance with the A-law and wherein time-efficient multiplication is used.

The arrangement for performing this processing operation, defined in (13), is shown in FIG. 4. This arrangement of FIG. 4 differs from the arrangement shown in FIG. 1 in the following respects:

1. The multiplier 7 which is required in the arrangement of FIG. 1 is no longer present in the arrangement shown in FIG. 4;
2. The multiplier 8 is implemented as a radix point translator;
3. The polarities of the multiplication factors f(k,j) and the numbers F(k,j), respectively, are stored in the storage locations IV and V of the storage medium 14; and
4. The numbers B(i−k) and F(k,j) are applied to an adding device 33, the output of which is connected to the input of the multiplication factor generator 12.

Should a μ-law non-recursive digital filter be realized, then it follows from (11) and (12) that $$g(i) = \sum_{k=0}^{N-1} \sum_j p(i-k) \cdot \text{sign }[f(k,j)] \cdot E(i-k) 2^{s(i-k)+F(k,j)} + \quad (14)$$
$$-\sum_{k=0}^{N-1} \sum_j p(i-k) \cdot \text{sign }[f(k,j)] \cdot 2^{F(k,j)} \cdot (2^4 + 2^{-1})$$

Figure 5:
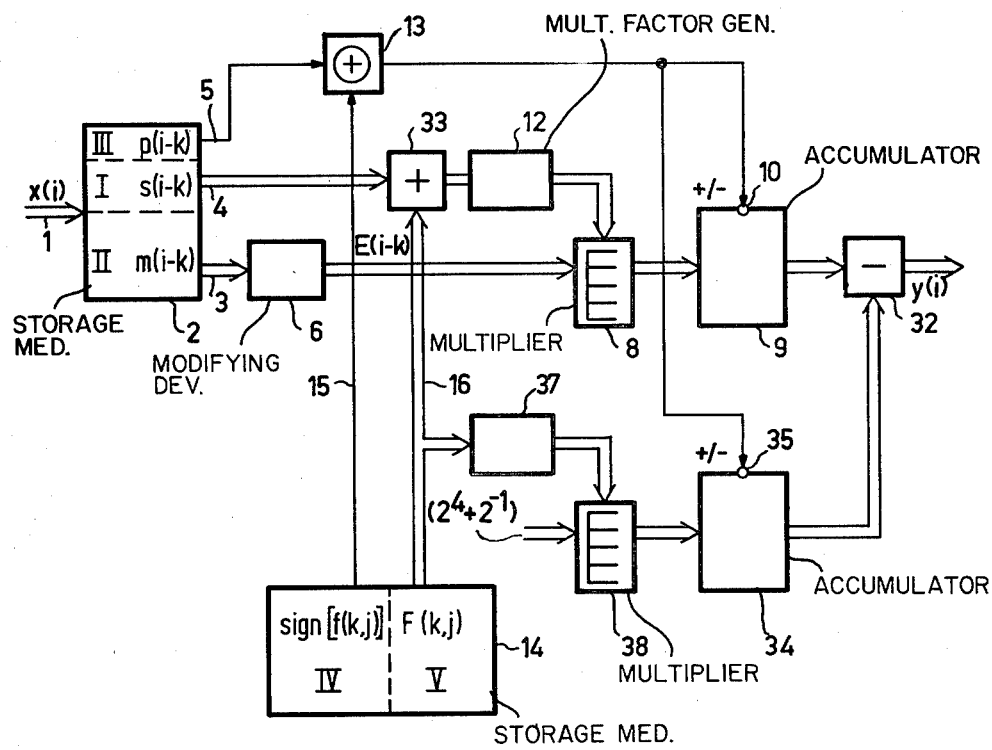
FIG. 5 shows a digital filter arrangement for filtering the pulse code-modulated signals compressed in accordance with the $\mu$-law and wherein time-efficient multiplication is used.

The arrangement for performing this processing operation, defined in (14), is shown in FIG. 5. The arrangement shown in FIG. 5 differs from the arrangement shown in FIG. 3 in the following respects:

1. The multiplier 7 required in the arrangement of FIG. 3 is not included in the arrangement shown in FIG. 5;
2. The multiplier 8 is again implemented as a radix point translator;
3. The polarities of the multiplication factors f(k,j) and the numbers F(k,j), respectively, are stored in the storage locations IV and V of the storage medium 14;
4. The numbers s(i−k) and F(k,j) are applied to the adding device 33 the output of which is connected to the input of the multiplicator factor generator 12;

5. The multiplier 36 required in the arrangement of FIG. 3 is not included in the arrangement shown in FIG. 5;

6. For generating the number given by the second term in (14), the numbers F(k,j) are also applied to a second multiplication factor generator 37, which may be of a similar implementation as the multiplication factor generator 12, the output numbers $2^{F(k,j)}$ of generator 37 controlling the setting of a second radix point translator 38 to which the fixed number $2^4 + 2^{-1}$ is applied; and 7. The outputs of the radix point translator 38 are connected to inputs of the accumulator 34, whose adding-subtracting control input 35 is connected to the output of the modulo-2-adder 13, and whose output is directly connected to an input of the subtracting device 33.

It should be noted that the number of multiplication factors f(k,j), which together characterise a given filter coefficient a(k), may differ from coefficient to coefficient. To separate associated multiplication factors, from the other multiplication factors it is possible to store, in the manner extensively described in reference 4, a plurality of "stopping numbers" in the storage locations V of the storage medium 14 in such a way that each time, after a group of numbers F(k,j), which together characterise a given filter coefficient a(k), is read from the store, a "stopping number" occurs. Reference 4 describes how this "stopping number" can be utilised for reading, for example, a new code group x(i) for storage medium 2.

5. General remarks

1. Each of the arrangements shown in the FIGS. 1, 3, 4 and 5 comprises an accumulator of the type which adds a number applied to it to the accumulator content or subtracts it therefrom. Such an accumulator comprises adders as well as subtractors. A considerably simpler accumulator circuit can be obtained by translating the numbers, formed by the numbers produced by the multiplying means 8 and the associated polarity bits, produced by the modulo-2-adder, first either into one's complement or into two's-complement from before applying these numbers to the accumulator, as this makes it possible to implement the accumulator with adders only.

2. By storing several sets of filter coefficients (or numbers equivalent thereto) in storage medium 14 in the manner as extensively explained in, for example, reference 8, each set comprising N filter coefficients, the arrangements shown in FIGS. 1, 3, 4 and 5 can also be used as interpolating digital filters.

What is claimed is:

1. A digital filter arrangement for filtering non-uniformly quantised pulse code-modulated signals formed by a sequence of code groups x(i) each comprising a segment number s(i) and a mantissa number m(i), which digital filter arrangement comprises:
 a first storage medium comprising first storage locations for storing the segment numbers s(i−k), second storage locations for storing the mantissa numbers m(i−k) of a given plurality of N consecutive code groups x(i−k), where k=0, 1, 2, ... N−1 and i= ... −3, −2, 0, 1, 2, 3, ..., and outputs for sequentially supplying the stored code groups;
 a second storage medium for storing the absolute magnitudes $|a(k)|$ of N filter coefficients a(k) and having outputs for sequentially supplying the stored absolute magnitudes; means coupled to the second storage location of said first storage medium for modifying the mantissa numbers m(i−k) and for generating modified mantissa numbers E(i−k);
 first multiplying means connected to the modifying means and coupled to the second storage medium for generating first product numbers $z_1(i-k) = E(i-k)|a(k)|$;
 second multiplying means connected to the first multiplying means;
 means for coupling the second multiplying means to the output of the first storage locations of said first storage medium; and
 accumulating means coupled to the second multiplying means for accumulating the product formed in said second multiplying means.

2. An arrangement for filtering non-uniformly quantised pulse code-modulated signals formed by a sequence of code groups x(i) each comprising a segment number s(i) and a mantissa number m(i), wherein said arrangement comprises:
 a first storage medium comprising first storage locations for storing the segment numbers s(i−k), second storage locations for storing the mantissa numbers m(i−k) of a plurality of N consecutive code groups x(i−k) where k=0, 1, 2, ... N−1 and i= ... −3, −2, −1, 1, 2, 3, ..., and outputs for sequentially supply stored code groups;
 a second storage medium for storing N sets of numbers F(k,j), each set characterizing the magnitude $|a(k)|$ of a filter coefficient a(k), said second storage medium having outputs for supplying the stored magnitudes;
 means connected to the output of the second storage locations of said first storage medium for modifying the mantissa numbers m(i−k) and for generating modified mantissa numbers E(i−k);
 adding means coupled to the output of the second storage medium for sequentially generating sum numbers D(k−j);
 means for coupling the adder means to the output of first storage locations of said first storage medium;
 multiplying means coupled to said adding means and the modifying means for sequentially generating product numbers $z_2(i-k)\ [=E(i-k)\cdot 2^{D(k,j)}]$; and
 means for accumulating the product numbers $z_2(i-k)$.

3. A digital filter arrangement as claimed in claim 1 or 2, wherein said coupling means comprise means connected to the output of said first storage locations of said first storage medium for interpreting said segment numbers s(i−k) and for generating numbers B(i−k) each characterizing a segment number s(i−k), and means for coupling the modifying means to the output of the first storage locations of said first storage medium.

* * * * *